United States Patent
Lei et al.

(10) Patent No.: US 12,527,018 B2
(45) Date of Patent: Jan. 13, 2026

(54) METHOD FOR MANUFACTURING METAL ZERO LAYER

(71) Applicant: Shanghai Huali Integrated Circuit Corporation, Shanghai (CN)

(72) Inventors: Haibo Lei, Shanghai (CN); Guangcai Fu, Shanghai (CN); Qi Shao, Shanghai (CN); Binbin Zha, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 393 days.

(21) Appl. No.: 18/342,254

(22) Filed: Jun. 27, 2023

(65) Prior Publication Data

US 2024/0162330 A1 May 16, 2024

(30) Foreign Application Priority Data

Nov. 11, 2022 (CN) .......................... 202211409523.2

(51) Int. Cl.
| | |
|---|---|
| *H01L 21/265* | (2006.01) |
| *H01L 21/285* | (2006.01) |
| *H01L 21/321* | (2006.01) |
| *H01L 21/768* | (2006.01) |
| *H10D 30/01* | (2025.01) |
| *H10D 62/00* | (2025.01) |
| *H10D 62/13* | (2025.01) |
| *H10D 64/01* | (2025.01) |
| *H10D 64/62* | (2025.01) |
| *H10D 84/83* | (2025.01) |
| *H10D 84/85* | (2025.01) |

(52) U.S. Cl.
CPC ... *H10D 30/0212* (2025.01); *H01L 21/26513* (2013.01); *H01L 21/3212* (2013.01); *H10D 64/017* (2025.01)

(58) Field of Classification Search
CPC .......... H01L 23/5329; H01L 23/53295; H01L 21/76822; H01L 21/26513; H01L 21/26586

See application file for complete search history.

(56) References Cited

U.S. PATENT DOCUMENTS

2022/0406655 A1\* 12/2022 Chen ................. H01L 21/76825

FOREIGN PATENT DOCUMENTS

CN         104900520 A  \*  9/2015  ........... H01L 21/265

\* cited by examiner

*Primary Examiner* — Sonya McCall-Shepard
(74) *Attorney, Agent, or Firm* — Quarles & Brady LLP

(57) ABSTRACT

The present application discloses a method for manufacturing a metal zero layer, comprising: step 1, etching a zero interlayer film to form a first trench; step 2, performing first Ge ion implantation to form a first Ge layer in the zero interlayer film and achieve first amorphization; step 3, performing second Ge ion implantation to form a second Ge layer in the zero interlayer film and achieve second amorphization, wherein the depth of the second Ge layer is greater than the depth of the first Ge layer, and the second Ge ion implantation is tilt ion implantation; step 4, forming a metal silicide layer on the surface of an amorphous silicon layer in a self-aligned manner; step 5, filling the first trench with a first metal layer; and step 6, performing chemical mechanical polishing to fully remove the first metal layer outside the first trench and achieve planarization.

16 Claims, 5 Drawing Sheets

METHOD FOR MANUFACTURING METAL ZERO LAYER

CROSS-REFERENCES TO RELATED APPLICATIONS

This application claims the priority to Chinese patent application No. CN202211409523.2, filed on Nov. 11, 2022, and entitled "METHOD FOR MANUFACTURING METAL ZERO LAYER", the disclosure of which is incorporated herein by reference in entirety.

TECHNICAL FIELD

The present application relates to a method for manufacturing a semiconductor integrated circuit, in particular to a method for manufacturing a metal zero layer (MO).

BACKGROUND

As the constant reduction of the critical dimension of semiconductor devices, for example, the critical dimension is reduced below 7 nm and 5 nm, the middle-of-line (MOL) metal interconnect resistance becomes particularly important. The device-design-point (DDP) requires: RON≈200-400 $\Omega \cdot \mu M$ and RC≤RON/10, where RON represents a source drain conduction resistance of the device, and RC represents a contact resistance, mainly a contact resistance formed by a metal zero layer and a bottom doped region.

At the 7 nm process node, CPP=48 nm, where CPP represents a step along the gate arrangement direction, i.e. the sum of the gate width and the gate spacing. ρC represents contact resistivity, and ρC formed by an existing material is $2 \times 10^{-9}$ $\Omega \cdot cm^2$, which cannot satisfy a design requirement at the 7 nm process node. When CPP is miniaturized to 40 nm, the requirement becomes higher: ρC needs to reach $8 \times 10^{-10}$ $\Omega \cdot cm^2$. Therefore, it is necessary to introduce a new material, such as Co, into intermediate metal, i.e., metal zero layer, at the process node below 7 nm and 5 nm, so as to satisfy the device requirement. In this case, a metal silicide layer between Co and a bottom epitaxial layer is typically TiSix, i.e., titanium silicide.

The introduction of titanium silicide (TiSix) and Co processes make the process extremely complex, and the shape and dimension of TiSix contribute significantly to the resistance of MO. The resistance is large when TiSix has a small volume and a small contact area.

The manufacturing method for existing a metal zero layer cannot effectively control the shape of TiSix and increase the dimension of TiSix, resulting in an increase in the resistance of the metal zero layer.

In addition, as the reduction of the process node, the pattern density on a semiconductor substrate changes significantly, and loadings of chemical mechanical polishing (CMP) in a pattern-dense region and a pattern-isolation region are different. After a trench of the metal zero layer is filled with Co, Co usually extends to the outer surface of the trench. In this case, CMP is required to implement planarization, so as to remove Co outside the trench. However, different loadings in different regions, i.e., different polishing rates, result in a poor planarization effect in the different regions. Moreover, charges are generated during the CMP process, and the presence of the charges can lead to an electrochemical reaction, ultimately resulting in a recess defect and a residue defect, which affect the product yield.

BRIEF SUMMARY

According to some embodiments in this application, a method for manufacturing a metal zero layer is disclosed in the following steps:

step 1, providing a semiconductor substrate provided with a zero interlayer film, wherein a first gate structure is formed on the semiconductor substrate, and a source drain epitaxial layer is formed on two sides of the first gate structure in a self-aligned manner; and etching the zero interlayer film in a formation region of the metal zero layer to form a first trench, wherein the first trench exposes the surface of the source drain epitaxial layer at the bottom thereof;

step 2, performing first Ge ion implantation, wherein the first Ge ion implantation forms a first Ge layer in the zero interlayer film, and simultaneously the first Ge ion implantation achieves first amorphization on the surface of the source drain epitaxial layer at the bottom of the first trench;

step 3, performing second Ge ion implantation, wherein the second Ge ion implantation forms a second Ge layer in the zero interlayer film, and simultaneously the second Ge ion implantation achieves second amorphization on the surface of the source drain epitaxial layer at the bottom of the first trench, wherein implantation energy of the second Ge ion implantation is greater than implantation energy of the first Ge ion implantation, and the depth of the second Ge layer is greater than the depth of the first Ge layer; and the second Ge ion implantation is tilt ion implantation, which increases a region of the second amorphization and increases the dimension of an amorphous silicon layer formed by the first amorphization and the second amorphization;

step 4, forming a metal silicide layer on the surface of the amorphous silicon layer at the bottom of the first trench in a self-aligned manner, wherein the dimension of the metal silicide layer is increased by increasing the dimension of the amorphous silicon layer;

step 5, filling the first trench with a first metal layer, wherein the first metal layer fully fills the first trench and extends to the surface of the zero interlayer film outside the first trench; and step 6, performing chemical mechanical polishing, wherein the chemical mechanical polishing fully removes the first metal layer on the surface of the zero interlayer film outside the first trench and makes a top surface of the first metal layer in the first trench flush with a top surface of the zero interlayer film outside the first trench, and the metal zero layer is composed of the first metal layer filling the first trench;

in a process of the chemical mechanical polishing, the first Ge layer and the second Ge layer jointly serve as a polishing stop layer to make the zero interlayer film in various regions have the same polishing loading; and the first Ge layer and the second Ge layer also serve as conductive layers to timely remove charges formed in the process of the chemical mechanical polishing, reducing electrochemical reactions and thereby reducing recess and reside defects.

In some cases, the source drain epitaxial layer in step 1 includes a source drain epitaxial seed crystal layer, a source drain epitaxial body layer, and a source drain epitaxial cap layer stacked in sequence.

In some cases, before step 1, the method further includes a step of forming the source drain epitaxial layer, wherein in a process of forming the source drain epitaxial layer, the thickness of the source drain epitaxial cap layer is increased from an initial design value by 2-3 nm, so as to increase the dimension of the metal silicide layer.

In some cases, by adjusting an implantation angle of the second Ge ion implantation in step 3, the dimension of the amorphous silicon layer is increased from a value in the case of non-tilt ion implantation by 2-3 nm.

In some cases, step 4 includes the following substeps:

step 41, forming a second metal layer, wherein the second metal layer covers the surface of the amorphous silicon layer, a side face of the trench at the top of the amorphous silicon layer, and an outer surface of the trench; and step 42, performing annealing so that silicon of the second metal layer and the amorphous silicon layer or the source drain epitaxial layer at the bottom of the amorphous silicon layer undergoes a siliconization reaction to form the metal silicide layer, wherein the amorphous silicon layer is fully consumed.

In some cases, the metal silicide layer formed in step 4 includes titanium silicide, molybdenum silicide, nickel silicide, or ruthenium silicide.

In some cases, when the metal silicide layer is titanium silicide, the second metal layer in step 41 includes a stack layer of a Ti layer and TiN.

In some cases, the annealing in step 42 is peak annealing, such that the metal silicide presents a structure conformal to the amorphous silicon layer.

In some cases, process conditions for the peak annealing include a temperature of 600° C. and a time of 3 seconds.

In some cases, the first amorphization and the second amorphization make the surface of the amorphous silicon layer present a pocket morphology.

In some cases, step 2 and step 3 are performed in an inverted order.

In some cases, the implantation energy of the first Ge ion implantation is 20-50 keV, and an implantation dose is 2E15 $cm^{-2}$.

In some cases, the implantation energy of the second Ge ion implantation is 20-50 keV, an implantation dose is 2E15 $cm^{-2}$, and a maximum implantation angle is greater than 30 degrees.

In some cases, the material of the first metal layer in step 5 includes Co.

In some cases, step 5 includes the following substeps:

step 51, forming a Co seed crystal layer; and step 52, forming a Co body layer on the surface of the Co seed crystal layer by means of an electroplating process, wherein the first metal layer is formed by stacking the Co seed crystal layer and the Co body layer.

In some cases, the semiconductor substrate in step 1 is integrated with both a PMOS and an NMOS, the source drain epitaxial layer of the PMOS includes a source drain GeSi epitaxial layer, and the source drain epitaxial layer of the NMOS includes a source drain SiP epitaxial layer.

In the present application, two times of Ge ion implantation are performed after the formation of the first trench corresponding to the metal zero layer. The two times of Ge ion implantation can form two Ge layers having different depths in the zero interlayer film and simultaneously achieve two times of amorphization on the surface of the source drain epitaxial layer at the bottom of the first trench.

The two Ge layers having different depths can serve as a stop layer during the chemical mechanical polishing corresponding to the metal zero layer, so as to make the zero interlayer film in various regions, such as various regions having different pattern densities, have the same polishing loading. The Ge layers also serve as conductive layers to timely remove charges formed in the process of the chemical mechanical polishing, reducing electrochemical reactions and thereby reducing recess and reside defects resulting from the electrochemical reactions.

Moreover, the two times of amorphization in the present application can effectively adjust the morphology and dimension of the amorphous silicon layer formed by the amorphization, ultimately improving the morphology of the amorphous silicon layer and increasing the dimension of the amorphous silicon layer, and thereby facilitating the improvement of the morphology of the metal silicide and the increase of the dimension of the metal silicide. For example, by making the metal silicide conformal to the amorphous silicon layer, the morphology and dimension of the metal silicide can change in accordance with the morphology and dimension of the amorphous silicon layer. In this way, the morphology of the metal silicide can be improved, for example, the morphology of the metal silicide is pocket-shaped, and the dimension of the metal silicide can be increased. Eventually, the contact resistance can be reduced, thereby reducing the resistance of the metal zero layer.

In addition, in the present application, by increasing the thickness of the source drain epitaxial cap layer from the initial design value by 2-3 nm in advance, the dimension of the metal silicide can be further increased, thereby further reducing the resistance.

BRIEF DESCRIPTION OF THE DRAWINGS

The present application will be further described in detail below with reference to the drawings and specific implementations.

DETAILED DESCRIPTION OF THE DISCLOSURE

Figure 1:
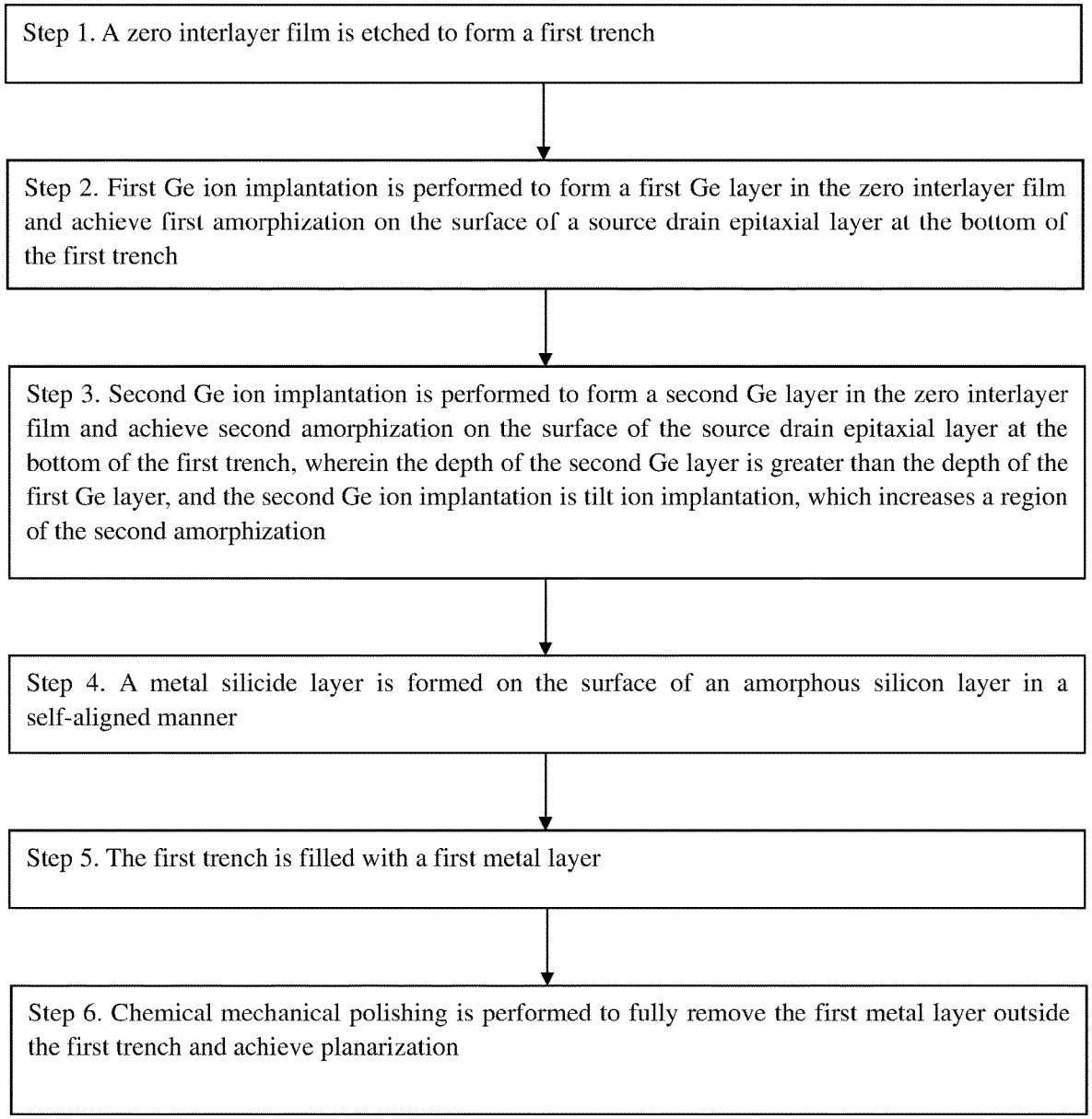
FIG. 1 is a flowchart of a method for manufacturing a metal zero layer according to an embodiment of the present application.
Figure 2A:
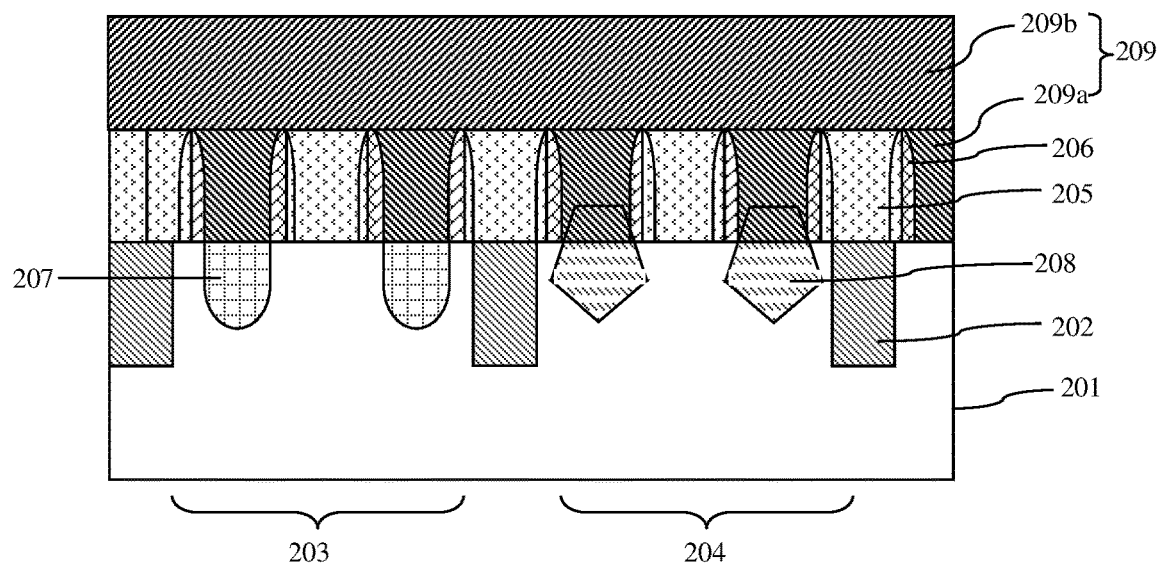
FIGS. 2A-2G are schematic diagrams of device section structures in steps of the method for manufacturing a metal zero layer according to an embodiment of the present application.

FIG. 1 is a flowchart of a method for manufacturing a metal zero layer 214 according to an embodiment of the present application. FIGS. 2A-2G are schematic diagrams of device section structures in steps of the method for manufacturing the metal zero layer 214 according to this embodiment of the present application. The method for manufacturing the metal zero layer 214 according to this embodiment of the present application includes the following steps:

Step 1. Referring to FIG. 2A, a semiconductor substrate 201 provided with a zero interlayer film 209 is provided, wherein a first gate structure 205 is formed on the semiconductor substrate 201, and a source drain epitaxial layer is formed on two sides of the first gate structure 205 in a self-aligned manner; and the zero interlayer film 209 in a formation region of the metal zero layer 214 is etched to form a first trench, wherein the first trench exposes the surface of the source drain epitaxial layer at the bottom thereof.

In this embodiment of the present application, the source drain epitaxial layer in step 1 includes a source drain epitaxial seed crystal layer, a source drain epitaxial body layer, and a source drain epitaxial cap layer stacked in sequence.

Before step 1, the method further includes a step of forming the source drain epitaxial layer, wherein in a process of forming the source drain epitaxial layer, the thickness of the source drain epitaxial cap layer is increased from an initial design value by 2-3 nm, so as to increase the dimension of a metal silicide layer 213.

Referring to FIG. 2A, in this embodiment of the present application, before the formation of the first trench, a formation process of the zero interlayer film 209 is completed, including the following:

A field oxide, such as a shallow trench isolation 202, is formed on the semiconductor substrate 201, such as a silicon substrate. The shallow trench isolation 202 defines each active region.

MOS transistors on the same semiconductor substrate 201 typically include both an NMOS and a PMOS. In FIG. 2A, an NMOS is formed in a region indicated by the brace 203, and a PMOS is formed in a region indicated by the brace 204.

The doped region at the bottom of the first trench is a source drain region of a MOS transistor, and the source drain epitaxial layer serves as a constituent part of the source drain region of the MOS transistor. The source drain epitaxial layer of the PMOS includes a source drain GeSi epitaxial layer 208. The source drain epitaxial layer of the NMOS includes a source drain SiP epitaxial layer 207.

Each of the MOS transistors includes the first gate structure 205, and the first gate structure 205 is typically a high-dielectric constant metal gate formed by means of a gate-last process. A sidewall spacer 206 is formed on a side face of the first gate structure 205. In the gate-last process, a dummy gate structure is usually first formed in a formation region of the first gate structure 205, and the sidewall spacer 206 and the source drain region are formed using the dummy gate structure in a self-aligned manner.

The zero interlayer film 209 includes a first partial interlayer film 209a and a second partial interlayer film 209b.

A contact polishing stop layer (not shown) is usually formed before formation of the first partial interlayer film 209a. After the first partial interlayer film 209a is planarized, a top surface of the first partial interlayer film 209a is flush with a top surface of the dummy gate structure, then the dummy gate structure is removed, and the first gate structure 205 is formed in a region where the dummy gate structure is removed. Subsequently, the second partial interlayer film 209b is formed.

Figure 2B:
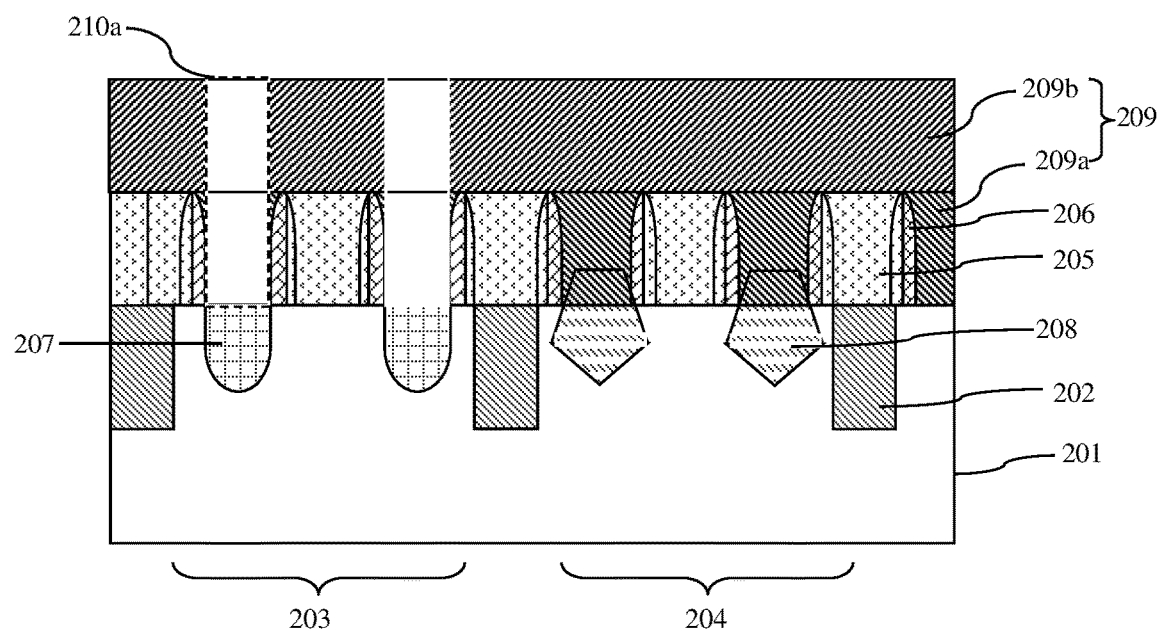

In this embodiment of the present application, the trench is formed by two times of patterned definition and etching, which are respectively as follows:

Referring to FIG. 2B, a formation region of the first trench at the top of the source drain region of the NMOS is defined by means of a photolithography process, then etching is performed to form the first trench at the top of the source drain region of the NMOS. In FIG. 2B, the first trench at the top of the source drain region of the NMOS is individually marked with a mark 210a.

Figure 2C:
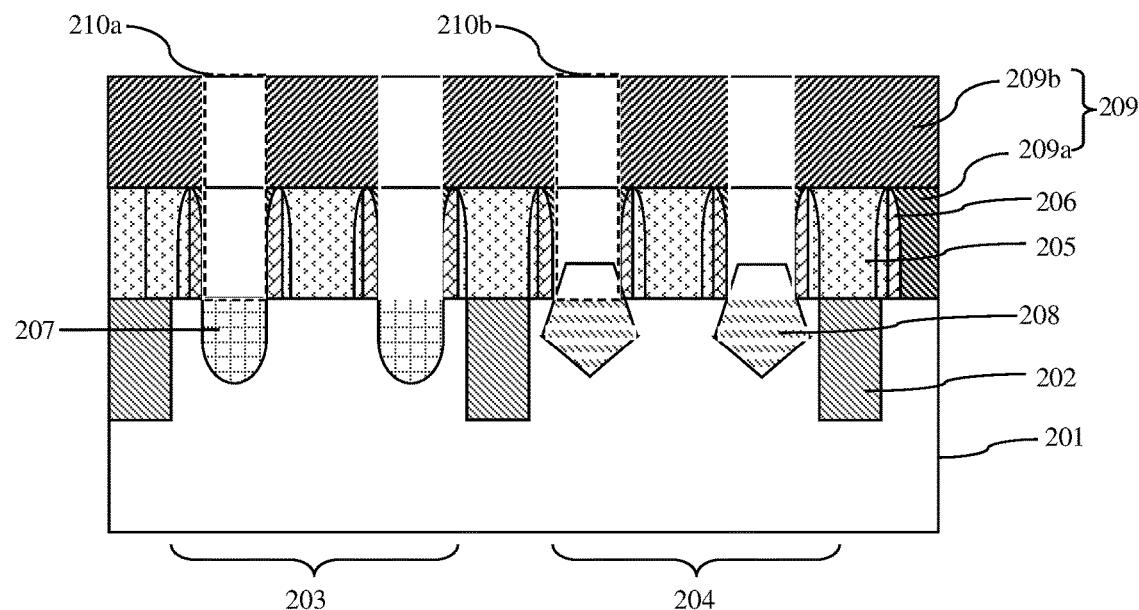

Subsequently, referring to FIG. 2C, a formation region of the first trench at the top of the source drain region of the PMOS is defined by means of a second photolithography process, then etching is performed to form the first trench at the top of the source drain region of the PMOS. In FIG. 2C, the first trench at the top of the source drain region of the PMOS is individually marked with a mark 210b.

Figure 2D:
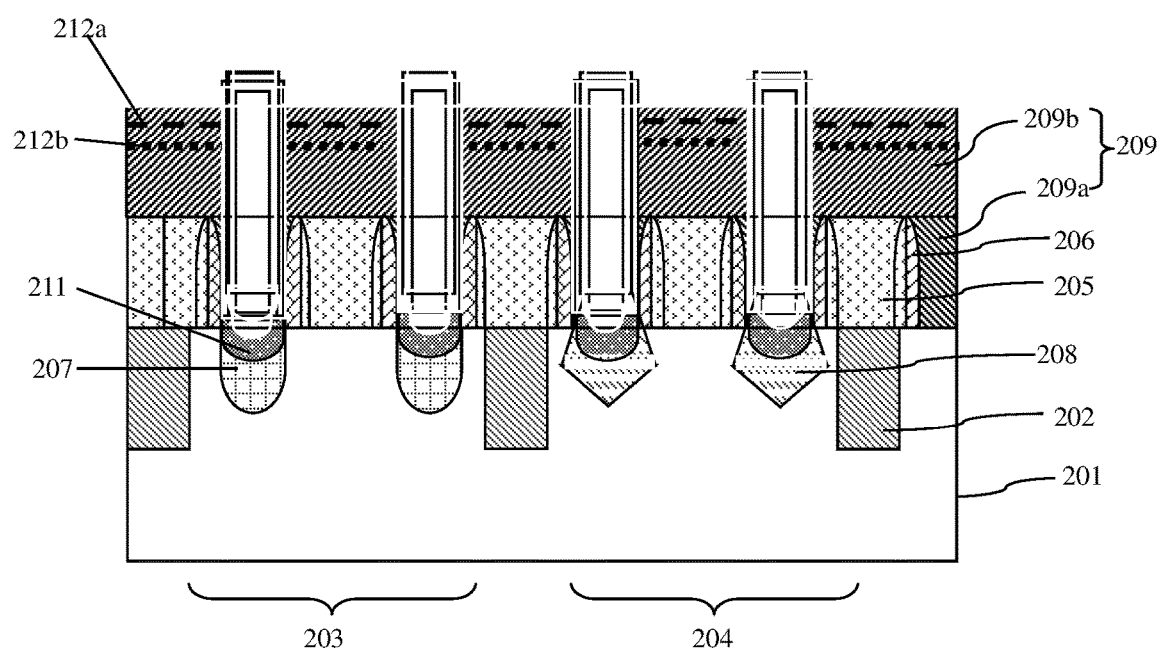

Step 2. Referring to FIG. 2D, first Ge ion implantation is performed, wherein the first Ge ion implantation forms a first Ge layer 212a in the zero interlayer film 209, and simultaneously the first Ge ion implantation achieves first amorphization on the surface of the source drain epitaxial layer at the bottom of the first trench.

In some embodiments, implantation energy of the first Ge ion implantation is 20-50 keV, and an implantation dose is $2E15$ $cm^2$.

Step 3. Referring to FIG. 2D, second Ge ion implantation is performed, wherein the second Ge ion implantation forms a second Ge layer 212b in the zero interlayer film 209, and simultaneously the second Ge ion implantation achieves second amorphization on the surface of the source drain epitaxial layer at the bottom of the first trench.

Implantation energy of the second Ge ion implantation is greater than the implantation energy of the first Ge ion implantation, and the depth of the second Ge layer 212b is greater than the depth of the first Ge layer 212a.

The second Ge ion implantation is tilt ion implantation, which increases a region of the second amorphization and increases the dimension of an amorphous silicon layer 211 formed by the first amorphization and the second amorphization.

In this embodiment of the present application, by adjusting an implantation angle of the second Ge ion implantation, the dimension of the amorphous silicon layer 211 is increased from a value in the case of non-tilt ion implantation by 2-3 nm. The first amorphization and the second amorphization make the surface of the amorphous silicon layer 211 present a pocket morphology.

In this embodiment of the present application, step 2 and step 3 can be performed in an inverted order. That is, in some embodiments, step 2 can be performed before step 3; and in other embodiments, step 3 can be performed before step 2.

In some embodiments, the implantation energy of the second Ge ion implantation is 20-50 keV, an implantation dose is $2E15$ $cm^{-2}$, and a maximum implantation angle is greater than 30 degrees.

Figure 3:
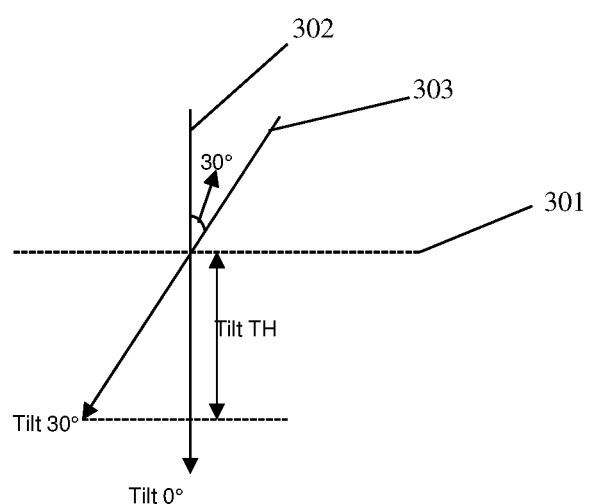
FIG. 3 is a schematic diagram of an implantation angle and an implantation depth of second Ge ion implantation in the method for manufacturing a metal zero layer according to an embodiment of the present application.

An implantation angle of ion implantation refers to an angle between the ion implantation and the normal of an implantation face. FIG. 3 is a schematic diagram of the implantation angle and the implantation depth of the second Ge ion implantation in the method for manufacturing the metal zero layer according to this embodiment of the present application. A face corresponding to the mark 301 is the implantation face, and a line corresponding to the mark 302 is the normal. An implantation angle of implantation along the normal is 0 degree, and the implantation angle of 0 degree is represented by Tilt 0° in FIG. 3. An angle between a line corresponding to the mark 303 and the normal is 30 degrees, an implantation angle of implantation along the line 303 is 30 degrees, and the implantation angle of 30 degrees is represented by Tilt 30° in FIG. 3. The implantation depth corresponding to Tilt 30° is Tilt TH. The thickness of an implantation region can be adjusted by adjusting the implantation energy and the implantation angle, and an implantation range can be further expanded by adjusting the implantation angle, that is, a lateral range is increased.

TABLE 1

| Implantation energy (eV) and implantation angle | Ge implantation depth (Å) |
|---|---|
| 20k, 0° | 200 |
| 30k, 0° | 269 |
| 30k, 30° | 233 |
| 50k, 0° | 399 |

As can be seen from Table 1, the range of the implantation region can be adjusted by adjusting the implantation energy and the implantation angle. Therefore, in this embodiment of the present application, the second Ge layer 212b and the first Ge layer 212a having different depths can be obtained via the configuration of two times of Ge ion implantation, the dimension of the amorphous silicon layer 211 is increased, and the contour of the amorphous silicon layer 211 is adjusted, so that the contour of the amorphous silicon layer 211 is pocket-shaped.

Figure 2E:
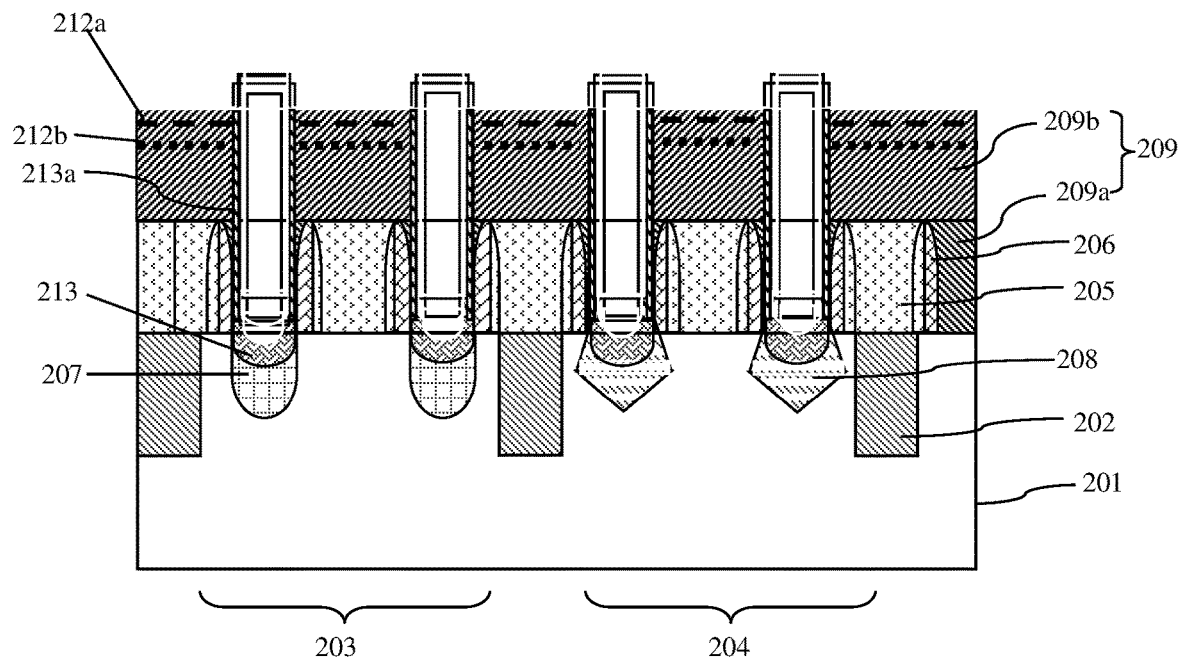

Step 4. Referring to FIG. 2E, a metal silicide layer 213 is formed on the surface of the amorphous silicon layer 211 at the bottom of the first trench in a self-aligned manner, wherein the dimension of the metal silicide layer 213 is increased by increasing the dimension of the amorphous silicon layer 211.

In this embodiment of the present application, step 4 includes the following substeps:

Step 41. A second metal layer 213a is formed, wherein the second metal layer 213a covers the surface of the amorphous silicon layer 211, a side face of the trench at the top of the amorphous silicon layer 211, and an outer surface of the trench.

In this embodiment of the present application, when the metal silicide layer 213 is titanium silicide, the second metal layer 213a in step 41 includes a stack layer of a Ti layer and TiN. In other embodiments, the metal silicide layer 213 includes molybdenum silicide, nickel silicide, or ruthenium silicide.

Step 42. Annealing is performed so that silicon of the second metal layer 213a and the amorphous silicon layer 211 or the source drain epitaxial layer at the bottom of the amorphous silicon layer 211 undergoes a siliconization reaction to form the metal silicide layer 213, wherein the amorphous silicon layer 211 is fully consumed.

In some preferred embodiments, the annealing in step 42 is peak annealing, such that the metal silicide presents a structure conformal to the amorphous silicon layer 211.

Process conditions for the peak annealing include a temperature of 600° C. and a time of 3 seconds.

Figure 2F:
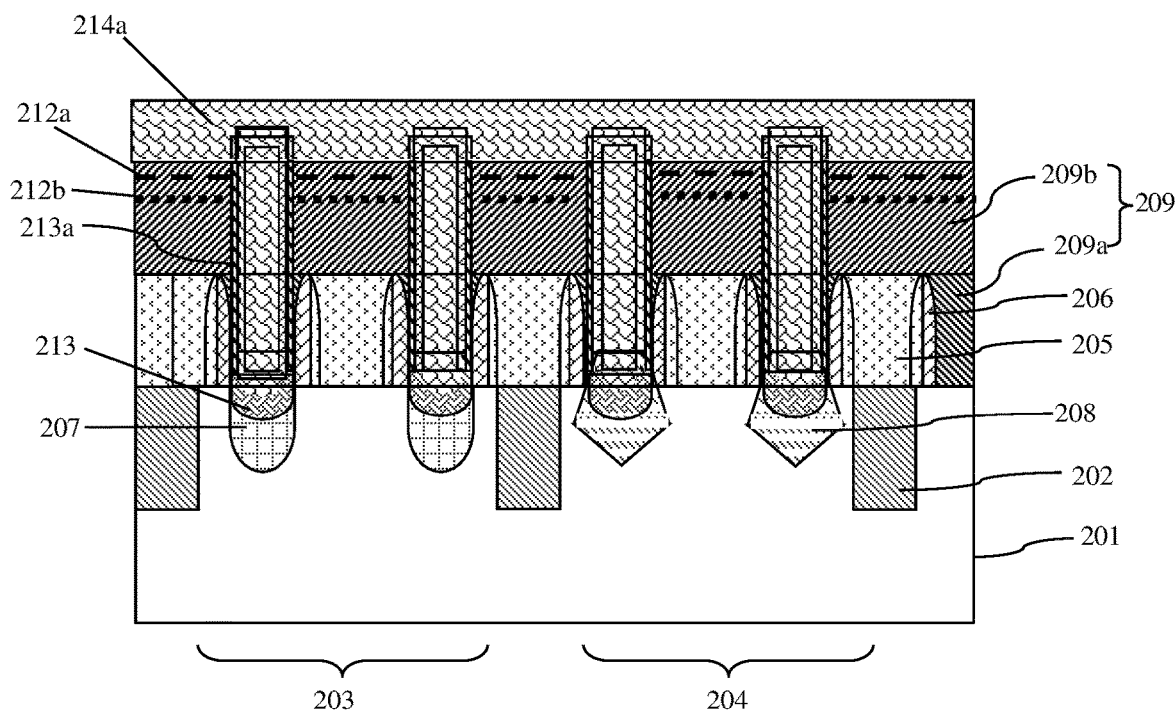

Step 5. Referring to FIG. 2F, the first trench is filled with a first metal layer 214a, wherein the first metal layer 214a fully fills the first trench and extends to the surface of the zero interlayer film 209 outside the first trench.

In this embodiment of the present application, the material of the first metal layer 214a includes Co.

Step 5 includes the following substeps:

Step 51. A Co seed crystal layer is formed.

Step 52. A Co body layer is formed on the surface of the Co seed crystal layer by means of an electroplating process, wherein the first metal layer 214a is formed by stacking the Co seed crystal layer and the Co body layer.

Figure 2G:
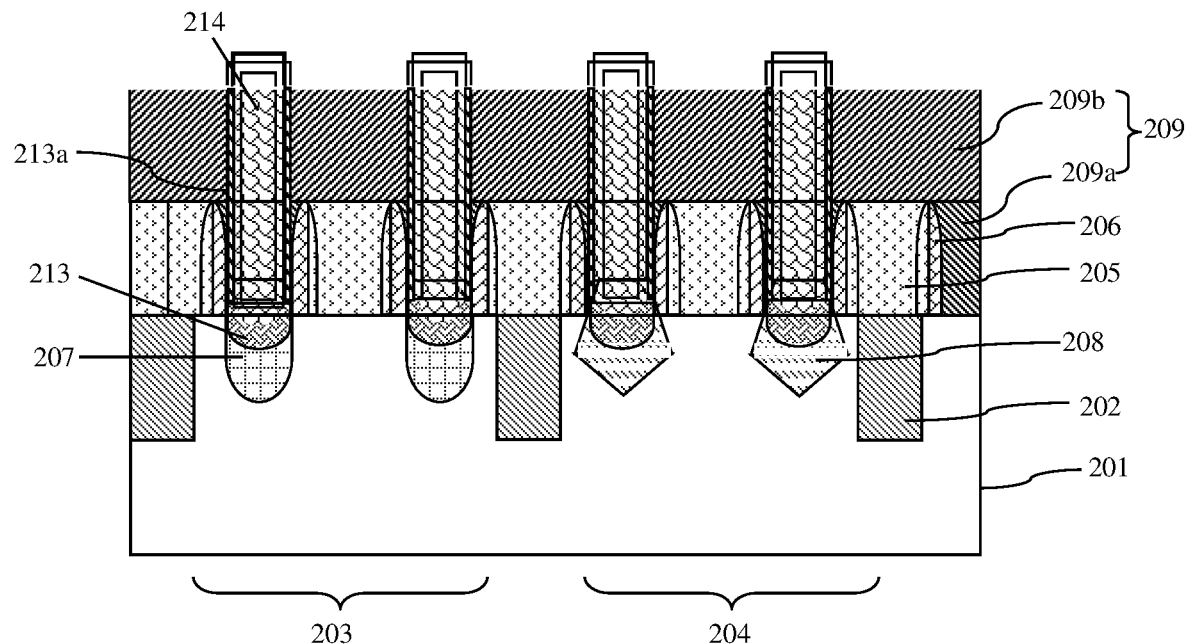

Step 6. Referring to FIG. 2G, chemical mechanical polishing is performed, wherein the chemical mechanical polishing fully removes the first metal layer 214a on the surface of the zero interlayer film 209 outside the first trench and makes a top surface of the first metal layer 214a in the first trench flush with a top surface of the zero interlayer film 209 outside the first trench, and the metal zero layer 214 is composed of the first metal layer 214a filling the first trench.

In a process of the chemical mechanical polishing, the first Ge layer 212a and the second Ge layer 212b jointly serve as a polishing stop layer to make the zero interlayer film 209 in various regions have the same polishing loading. The first Ge layer 212a and the second Ge layer 212b also serve as conductive layers to timely remove charges formed in the process of the chemical mechanical polishing, reducing electrochemical reactions and thereby reducing recess and reside defects.

In this embodiment of the present application, two times of Ge ion implantation are performed after the formation of the first trench corresponding to the metal zero layer 214.

The two times of Ge ion implantation can form two Ge layers having different depths in the zero interlayer film 209 and simultaneously achieve two times of amorphization on the surface of the source drain epitaxial layer at the bottom of the first trench.

The two Ge layers having different depths can serve as a stop layer during the chemical mechanical polishing corresponding to the metal zero layer 214, so as to make the zero interlayer film 209 in various regions, such as various regions having different pattern densities, have the same polishing loading. For example, the present application can achieve the same polishing rate in a pattern-dense region and a pattern-isolation region. The Ge layers also serve as conductive layers to timely remove charges formed in the process of the chemical mechanical polishing, reducing electrochemical reactions and thereby reducing recess and reside defects resulting from the electrochemical reactions.

Moreover, the two times of amorphization in this embodiment of the present application can effectively adjust the morphology and dimension of the amorphous silicon layer 211 formed by the amorphization, ultimately improving the morphology of the amorphous silicon layer 211 and increasing the dimension of the amorphous silicon layer 211, and thereby facilitating the improvement of the morphology of the metal silicide and the increase of the dimension of the metal silicide. For example, by making the metal silicide conformal to the amorphous silicon layer 211, the morphology and dimension of the metal silicide can change in accordance with the morphology and dimension of the amorphous silicon layer 211. In this way, the morphology of the metal silicide can be improved, for example, the morphology of the metal silicide is pocket-shaped, and the dimension of the metal silicide can be increased. Eventually, the contact resistance can be reduced, thereby reducing the resistance of the metal zero layer 214.

In addition, in this embodiment of the present application, by increasing the thickness of the source drain epitaxial cap layer from the initial design value by 2-3 nm in advance, the dimension of the metal silicide can be further increased, thereby further reducing the resistance.

The present application is described in detail above via specific embodiments, but these embodiments are not intended to limit the present application. Without departing from the principle of the present application, those skilled in the art can still make many variations and improvements, which should also be construed as falling into the protection scope of the present application.

What is claimed is:

1. A method for manufacturing a metal zero layer, comprising the following steps:
   step 1, providing a semiconductor substrate provided with a zero interlayer film, wherein a first gate structure is formed on the semiconductor substrate, and a source drain epitaxial layer is formed on two sides of the first gate structure in a self-aligned manner; and etching the zero interlayer film in a formation region of the metal zero layer to form a first trench, wherein the first trench exposes the surface of the source drain epitaxial layer at the bottom thereof;

step 2, performing first Ge ion implantation, wherein the first Ge ion implantation forms a first Ge layer in the zero interlayer film, and simultaneously the first Ge ion implantation achieves first amorphization on the surface of the source drain epitaxial layer at the bottom of the first trench;

step 3, performing second Ge ion implantation, wherein the second Ge ion implantation forms a second Ge layer in the zero interlayer film, and simultaneously the second Ge ion implantation achieves second amorphization on the surface of the source drain epitaxial layer at the bottom of the first trench, wherein implantation energy of the second Ge ion implantation is greater than implantation energy of the first Ge ion implantation, and the depth of the second Ge layer is greater than the depth of the first Ge layer; and the second Ge ion implantation is tilt ion implantation, which increases a region of the second amorphization and increases the dimension of an amorphous silicon layer formed by the first amorphization and the second amorphization;

step 4, forming a metal silicide layer on the surface of the amorphous silicon layer at the bottom of the first trench in a self-aligned manner, wherein the dimension of the metal silicide layer is increased by increasing the dimension of the amorphous silicon layer;

step 5, filling the first trench with a first metal layer, wherein the first metal layer fully fills the first trench and extends to the surface of the zero interlayer film outside the first trench; and step 6, performing chemical mechanical polishing, wherein the chemical mechanical polishing fully removes the first metal layer on the surface of the zero interlayer film outside the first trench and makes a top surface of the first metal layer in the first trench flush with a top surface of the zero interlayer film outside the first trench, and the metal zero layer is composed of the first metal layer filling the first trench;

in a process of the chemical mechanical polishing, the first Ge layer and the second Ge layer jointly serve as a polishing stop layer to make the zero interlayer film in various regions have the same polishing loading; and the first Ge layer and the second Ge layer also serve as conductive layers to timely remove charges formed in the process of the chemical mechanical polishing, reducing electrochemical reactions and thereby reducing recess and reside defects.

2. The method for manufacturing a metal zero layer according to claim 1, wherein the source drain epitaxial layer in step 1 comprises a source drain epitaxial seed crystal layer, a source drain epitaxial body layer, and a source drain epitaxial cap layer stacked in sequence.

3. The method for manufacturing a metal zero layer according to claim 2, before step 1, further comprising a step of forming the source drain epitaxial layer, wherein in a process of forming the source drain epitaxial layer, the thickness of the source drain epitaxial cap layer is increased from an initial design value by 2-3 nm, so as to increase the dimension of the metal silicide layer.

4. The method for manufacturing a metal zero layer according to claim 3, wherein by adjusting an implantation angle of the second Ge ion implantation in step 3, the dimension of the amorphous silicon layer is increased from a value in the case of non-tilt ion implantation by 2-3 nm.

5. The method for manufacturing a metal zero layer according to claim 1, wherein step 4 comprises the following substeps:

step 41, forming a second metal layer, wherein the second metal layer covers the surface of the amorphous silicon layer, a side face of the trench at the top of the amorphous silicon layer, and an outer surface of the trench; and step 42, performing annealing so that silicon of the second metal layer and the amorphous silicon layer or the source drain epitaxial layer at the bottom of the amorphous silicon layer undergoes a siliconization reaction to form the metal silicide layer, wherein the amorphous silicon layer is fully consumed.

6. The method for manufacturing a metal zero layer according to claim 5, wherein the metal silicide layer formed in step 4 comprises titanium silicide, molybdenum silicide, nickel silicide, or ruthenium silicide.

7. The method for manufacturing a metal zero layer according to claim 6, wherein when the metal silicide layer is titanium silicide, the second metal layer in step 41 comprises a stack layer of a Ti layer and TiN.

8. The method for manufacturing a metal zero layer according to claim 7, wherein the annealing in step 42 is peak annealing, such that the metal silicide presents a structure conformal to the amorphous silicon layer.

9. The method for manufacturing a metal zero layer according to claim 8, wherein process conditions for the peak annealing comprise a temperature of 600° C. and a time of 3 seconds.

10. The method for manufacturing a metal zero layer according to claim 8, wherein the first amorphization and the second amorphization make the surface of the amorphous silicon layer present a pocket morphology.

11. The method for manufacturing a metal zero layer according to claim 1, wherein step 2 and step 3 are performed in an inverted order.

12. The method for manufacturing a metal zero layer according to claim 1, wherein the implantation energy of the first Ge ion implantation is 20-50 keV, and an implantation dose is 2E15 $cm^{-2}$.

13. The method for manufacturing a metal zero layer according to claim 1, wherein the implantation energy of the second Ge ion implantation is 20-50 keV, an implantation dose is 2E15 $cm^{-2}$, and a maximum implantation angle is greater than 30 degrees.

14. The method for manufacturing a metal zero layer according to claim 1, wherein the material of the first metal layer in step 5 comprises Co.

15. The method for manufacturing a metal zero layer according to claim 14, wherein step 5 comprises the following substeps:

step 51, forming a Co seed crystal layer; and step 52, forming a Co body layer on the surface of the Co seed crystal layer by means of an electroplating process, wherein the first metal layer is formed by stacking the Co seed crystal layer and the Co body layer.

16. The method for manufacturing a metal zero layer according to claim 1, wherein the semiconductor substrate in step 1 is integrated with both a PMOS and an NMOS, the source drain epitaxial layer of the PMOS comprises a source drain GeSi epitaxial layer, and the source drain epitaxial layer of the NMOS comprises a source drain SiP epitaxial layer.

\* \* \* \* \*